United States Patent
Akram

[11] Patent Number: 6,103,613
[45] Date of Patent: Aug. 15, 2000

[54] METHOD FOR FABRICATING SEMICONDUCTOR COMPONENTS WITH HIGH ASPECT RATIO FEATURES

[75] Inventor: Salman Akram, Boise, Id.

[73] Assignee: Micron Technology, Inc., Boise, Id.

[21] Appl. No.: 09/033,041

[22] Filed: Mar. 2, 1998

[51] Int. Cl.[7] .................................................. H01L 21/44
[52] U.S. Cl. ...................... 438/597; 438/670; 438/545; 438/669; 438/655
[58] Field of Search ..................................... 438/652, 670, 438/589, 595, 597, 618, 649, 651, 655, 666, 669, 671, 696, 717

[56] References Cited

U.S. PATENT DOCUMENTS

| | | | |
|---|---|---|---|
| 4,952,272 | 8/1990 | Okino et al. . | |
| 5,177,439 | 1/1993 | Liu et al. . | |
| 5,354,705 | 10/1994 | Mathews et al. | 437/52 |
| 5,478,779 | 12/1995 | Akram . | |
| 5,483,741 | 1/1996 | Akram et al. | 29/846 |
| 5,523,697 | 6/1996 | Farnworth et al. . | |
| 5,607,818 | 3/1997 | Akram et al. | 430/311 |
| 5,686,317 | 11/1997 | Akram et al. | 437/8 |

OTHER PUBLICATIONS

*SUSS Report*, Karl Suss, vol. 10, Third/Fourth Quarter 1996, pp. 1–3.

*Primary Examiner*—Sheila V. Clark
*Attorney, Agent, or Firm*—Stephen A. Gratton

[57] ABSTRACT

A method for fabricating an interconnect with high aspect ratio contact members is provided. The interconnect is adapted to make electrical connections with a semiconductor component, such as a die, a wafer, or a chip scale package for testing. The method includes providing a substrate with projections, and forming a first conductive layer on the projections and substrate. The first conductive layer is then patterned using a resist mask having a thickness greater than a height of the projections. The resist mask can be a thick film resist that includes an epoxy resin, an organic solvent and a photo initiator. A second conductive layer is then formed on the projections, and patterned using a second resist mask having a thickness less than the height of the projections. Each contact member includes a projection with a tip portion having an exposed portion of the first conductive layer, and with a portion of the second conductive layer providing an electrical path to the projection.

24 Claims, 4 Drawing Sheets

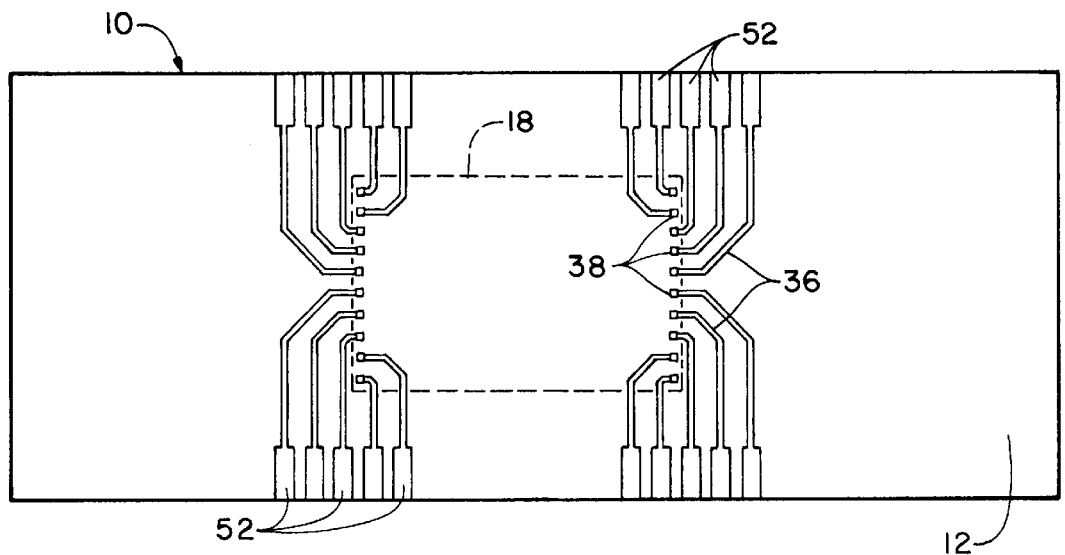
FIGURE 2
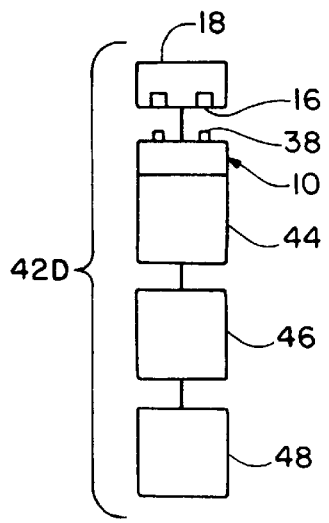
FIGURE 3A
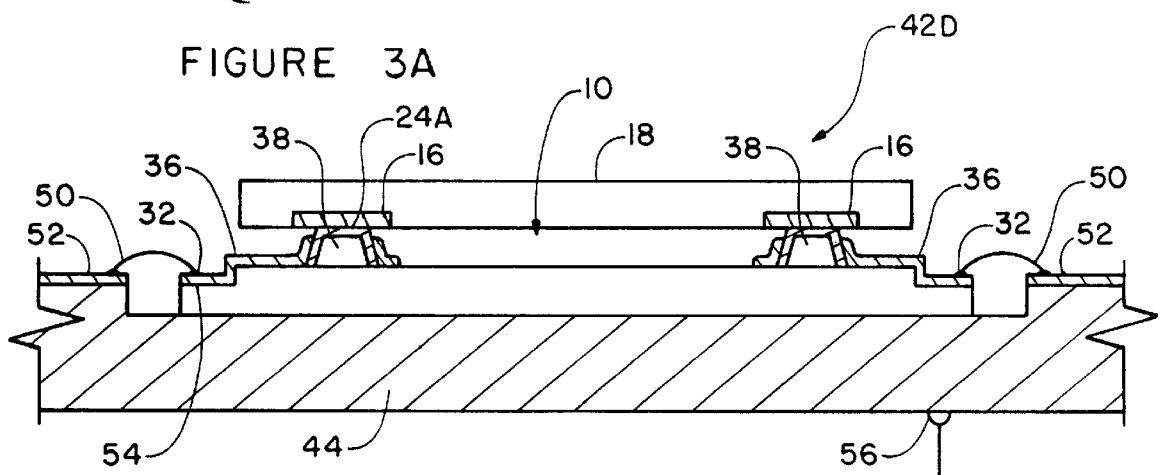
FIGURE 3B
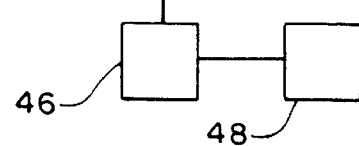

METHOD FOR FABRICATING SEMICONDUCTOR COMPONENTS WITH HIGH ASPECT RATIO FEATURES

FIELD OF THE INVENTION

This invention relates generally to semiconductor manufacture and specifically to a method for fabricating semiconductor components with high aspect ratio features.

BACKGROUND OF THE INVENTION

Semiconductor components such as dice, and interconnects for electrically engaging dice, can include high aspect ratio features. A "high aspect ratio feature" means that a height, or depth, of the feature is several times greater than a width, or diameter, of the feature. For example, features having aspect ratios (e.g., height/width) of about 5 or more, are sometimes considered high aspect ratio features.

One example of a semiconductor component that includes high aspect ratio features is the interconnect described in U.S. Pat. Nos. 5,483,741 and 5,686,317 to Akram et al. This interconnect includes contact members adapted to electrically engage corresponding contact locations on a semiconductor die for testing. The contact members on the interconnect include projections etched on a silicon substrate. A representative height of the projections, measured from the surface of the substrate to the tips of the projections, can be between about 3 to 10 mils. A representative width of each side of the projections can be from 0.5 to 5 mils.

During fabrication of the interconnect, the projections must be covered with an electrically conductive layer. One method for forming the conductive layer includes a lithographic process, in which a metal is blanket deposited on the substrate, then etched using a photopatterned layer of resist. Typically, the resist is applied using a spin coater, which is adapted to apply a quantity of resist as the substrate is spun to distribute the resist.

This type of high aspect ratio feature is difficult cover with metal using conventional lithographic processes. In particular problems can occur because the resist tends to slide off the sidewalls and tips of the projections, and to pool on the surface of the substrate. This phenomena is sometimes referred to as poor step coverage. A thickness of the resist layer can also be uneven due to the uneven topography of the substrate. The poor step coverage, and unevenness of the resist layer, can produce defects during photopatterning of the resist to form an etch mask. The defects in the etch mask can produce defects in the subsequently formed conductive layer. In particular, the metal on contact projections not protected by resist can be etched away, so that portions of the projections are not covered with metal.

Components other than interconnects, such as semiconductor dice can also include high aspect ratio features that must subsequently be covered with a photopatterned metal layer. For example, U.S. Pat. No. 5,354,705 to Matthews et al. discloses a method for fabricating semiconductor container structures having a high aspect ratio. The container structures function to provide an increased surface area for storage capacitors. When it is necessary to apply photoresist to these non-planar topographies, conventional resist deposition and photopatterning processes can provide poor results. Specifically, the photoresist may not form with a uniform thickness over the non-planar features, and may not cover the tips and sidewalls of the features. When a metal layer covering the container structures is subsequently patterned, defects can occur.

The present invention is directed to an improved method for fabricating semiconductor structures having high aspect ratio features.

SUMMARY OF THE INVENTION

In accordance with the present invention, an improved method for fabricating semiconductor structures having high aspect ratio features is provided. In an illustrative embodiment the method is used in the fabrication of an interconnect adapted to test semiconductor components, such as dice, wafers and chip scale packages. The interconnect includes a substrate with integrally formed contact members adapted to electrically engage contacts (e.g., bond pads) on the semiconductor components.

The method, simply stated, comprises forming the contact members with two conductive layers, which are patterned using two separate layers of thick film resist. A suitable thick film resist is a negative tone resist (comprising an epoxy resin, an organic solvent, and a photo initiator. This resist can be deposited with a thickness greater than the height of features which form the contact members.

To perform the method, the substrate of the interconnect is provided with patterns of projections formed thereon. The locations of the projections match the locations of contacts on a semiconductor component that can be tested using the interconnect. Initially, a first conductive layer is blanket deposited on the projections and substrate. Preferably, the first conductive layer comprises a metal silicide. Next, a first resist mask, which has a thickness greater than a height of the projections, is used to protect the projections while the first conductive layer is etched. Following etching of the first conductive layer, only the projections remain covered by the first conductive layer. The first resist mask is then removed, and a second conductive layer is deposited on the covered projections and substrate. A second resist mask having a thickness less than a height of the projections, is then used to etch the second conductive layer from the tips of the projections. During this etch step, portions of the second conductive layer on the substrate are also etched to form conductive traces. Alternately, the conductive traces can be formed separately from the second conductive layer using a separate metallization process.

The resultant contact members include the projections having tip portions covered by the first conductive layer, but with sidewalls covered by stacks comprising both conductive layers. The second conductive layer can also forms the conductive traces on the substrate to provide electrical paths to the contact members.

BRIEF DESCRIPTION OF THE DRAWINGS

FIG. 2 is a plan view of the completed interconnect taken along section line 2—2 of FIG. 1E;

FIG. 3A is a block diagram of a die level test system employing an interconnect constructed in accordance with the invention;

FIG. 3B is a schematic cross sectional view of the system shown in FIG. 3A;

DETAILED DESCRIPTION OF THE PREFERRED EMBODIMENTS

Figure 1A:
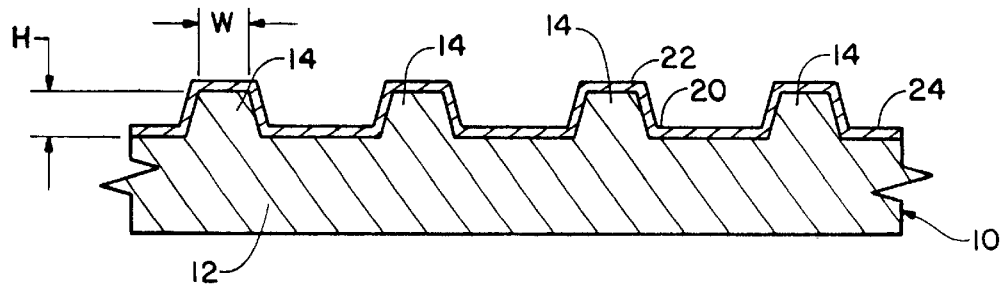
FIGS. 1A–1G are schematic cross sectional views illustrating a method for fabricating an interconnect in accordance with the invention.

Referring to FIGS. 1A–1E, steps in a method for fabricating an interconnect 10 in accordance with the invention are illustrated. Initially, as shown in FIG. 1A, a substrate 12 is provided. Preferred materials for the substrate 12 include semiconducting materials such as silicon, germanium, or silicon-on-glass. Other suitable materials include ceramic and glass filled resins (e.g., FR-4).

With the substrate 12 comprising a semiconducting material, an insulating layer (not shown) can be formed on exposed surfaces thereof, to provide electrical insulation for electrical elements to be subsequently formed. For simplicity the insulating layer is not shown in the figures. The insulating layer can comprise a deposited, or grown, oxide or nitride layer, having a thickness of from several hundred Å to several mils or more. The insulating layer can also comprise a polymer layer such as polyimide blanket deposited on the substrate 12 to a required thickness.

The substrate 12 also includes one or more patterns of raised projections 14 having bases 20 and tips 22. The locations of the projections 14 correspond to the locations of contacts 16 (FIG. 4) on a semiconductor component 18 (FIG. 4). The projections 14 can have a height "H" that is greater than a width "W" of the projections 14. A representative height of the projections 14, measured from a surface of the substrate 12, to the tips 22 of the projections 14, can be between about 3 to 10 mils. A representative width of the projections 14 measured at the tips 22 can be from 0.5 to 5 mils. The sidewalls of the projections 14 are angled slightly (E.g., 54° with the horizontal) as occurs with an etch formation process. Accordingly, the bases 20 of the projections 14 are slightly larger than the tips 22. A spacing between adjacent projections 14 will depend on a corresponding spacing of the contacts 16 (FIG. 4) on the components 18 (FIG. 4).

The projections 14 can be formed integrally with the substrate 12 using a wet or dry, anisotropic or isotropic etch process. The projections 14 can also be formed using a deposition process out of a different material than the substrate. Methods for fabricating the projections 14 are disclosed in U.S. Pat. Nos. 5,483,741 and 5,686,317 to Akram et al., which are incorporated herein by reference.

As disclosed in the above cited patents, the projections 14 can also include projecting members (not shown), such as blades or pointed members, projecting from the tips 22. For simplicity the projecting members have been omitted. The projecting members can be configured to penetrate the contacts 16 (FIG. 4) on the component 18 to a limited penetration depth.

With the substrate 12 and projections 14 provided, a first conductive layer 24 can be formed on the projections 14 and on the substrate 12. Preferably, the first conductive layer 24 comprises a metal silicide, such as $TiSi_2$, $WSi_2$, $TaSi_2$, $MoSi_2$, or $PtSi_2$. A metal silicide can be formed using a silicide process, as disclosed in the above cited patents. In general, the silicide process can be performed by depositing a silicon containing layer (e.g., polysilicon) on the substrate 12. A metal containing layer (e.g., Ti) is then deposited on the silicon containing layer, and the layers are heated to form a metal silicide (e.g., $TiSi_2$). Unreacted portions of the silicon containing layer, and the metal layer, can also be etched away leaving just the metal silicide.

Rather than a metal silicide, the first conductive layer 24 can comprise a conductive metal deposited using a suitable process. For example, a CVD process can be used to blanket deposit the first conductive layer 24 with a thickness of about 200 Å to 2000 Å. Exemplary metals for the first conductive layer 24 include aluminum, nickel, palladium, platinum, copper, gold, titanium, molybdenum, tantalum, tungsten or alloys of these metals.

Figure 1B:
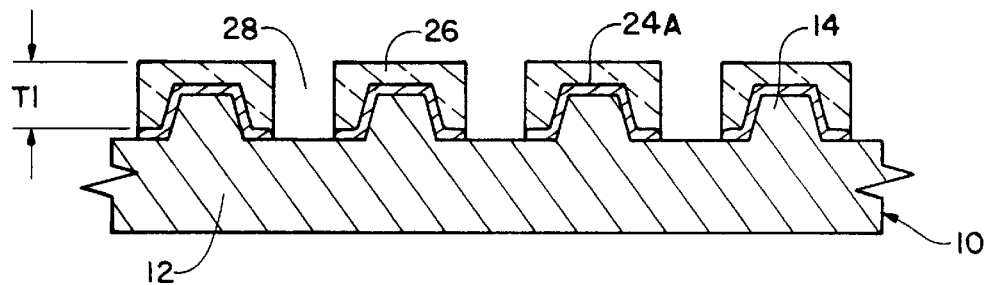

Referring to FIG. 1B, following formation of the first conductive layer 24, a first resist mask 26 is formed on the first conductive layer 24. The first resist mask 26 has a thickness "T1" that is greater than the height "H" of the projections 14 (T1>H).

Preferably, the first resist mask 26 comprises a thick film resist that can be deposited to a thickness greater than a conventional resist. One suitable resist is a negative tone, thick film resist sold by Shell Chemical under the trademark "EPON RESIN SU-8". This thick film resist includes an epoxy resin, an organic solvent (e.g., gamma-butyloracton), and a photoinitiator. The thick film resist can be deposited to a thickness of from about 1–50 mils. In addition, the thick film resist can be developed (i.e., etched) with high aspect ratio openings having almost vertical sidewalls.

A conventional resist coating apparatus, such as a spin coater, or a meniscus coater, can be used to deposit the thick film resist onto the projections 4 and substrate 12 with the required thickness "T1". The trick film resist can then be "prebaked" at about 95° C. for about 3 minutes. The prebaking step partially hardens the thick film resist for subsequent processes. Following prebaking, the thick film resist can be exposed in a desired pattern by directing exposure energy through a reticle (not shown). Exposure of the thick film resist can be with a conventional UV mask writer using a suitable UV dose. A representative UV dose for the previously described resist formulation is about 200 $mJ/cm^2$.

Following exposure, the thick film resist can be developed to form a required pattern of openings 28 in the first resist mask 26. One suitable wet chemical for developing the above resist formulation is a solution of PGMEA (propyleneglycol-monomethylether-acetate). Another suitable wet chemical is a hot (e.g., 105° C.) solution of n-methyl-2-pyrrolidone.

The openings 28 expose selected portions of the first conductive layer 24 (FIG. 1A) for etching. An etchant can be applied through the openings 28 to etch the exposed portions of the first conductive layer 24. Selection of the etchant will depend on the material used to construct the first conductive layer 24. For example, with the first conductive layer 24 comprising a metal, such as Ti, a suitable wet etchant is a mixture of ammonium hydroxide, and hydrogen peroxide (APM). Alternately, a (dry etch process can be used to etch the first conductive layer 24. For example, with the first conductive layer 24 comprising a metal silicide, such as $TiSi_2$, a suitable etchant species is 85 sccm of $Cl_2$, 40 sccm $BCl_3$ and 10 sccm $CF_4$ contained in a high density plasma at about 12 mtorr pressure.

In FIG. 1B, the first conductive layer 24 is illustrated following etching, and is designated 24A to distinguish it from the unetched layer shown in FIG. 1A. As shown in FIG. 1B, the etched first conductive layer 24A covers just the projections 14, and portions of the substrate 12 adjacent to the projections 14.

Figure 1C:
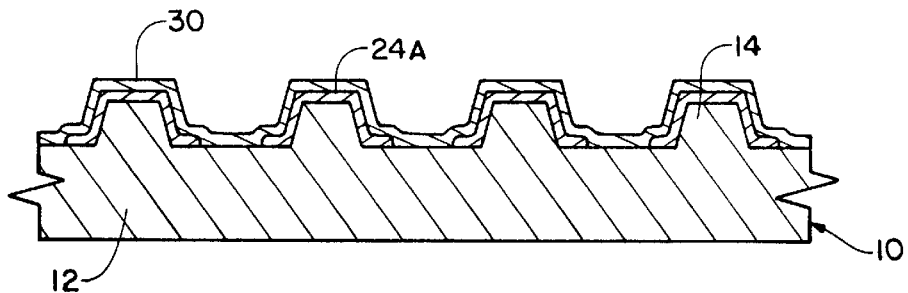

Referring to FIG. 1C, following etching of the first conductive layer 24, a second conductive layer 30 is deposited on the etched first conductive layer 24A and over the substrate 12. The second conductive layer 30 comprises a highly conductive metal such as aluminum, nickel, palladium, platinum, copper, gold, titanium, molybdenum, tantalum, tungsten, or alloys of these metals. The second conductive layer 30 can be blanket deposited using a deposition process, such as CVD, to a thickness of between about 600 Å to 1200 Å.

Figure 1D:
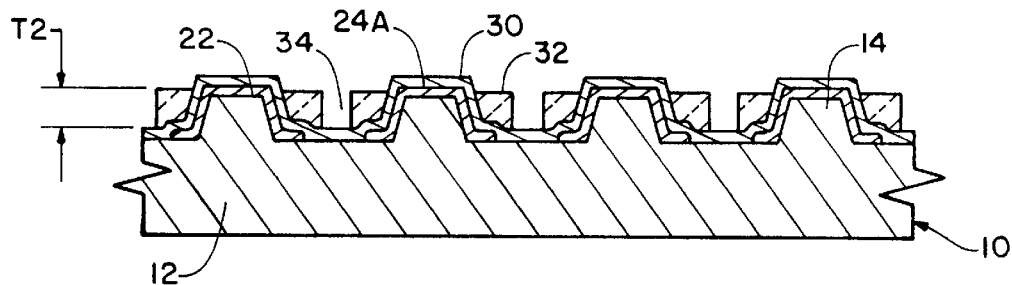

Referring to FIG. 1D, following deposition of the second conductive layer 30, a second resist mask 32 is formed on the second conductive layer 30. The second resist mask 32 comprises a thick film resist formed substantially as previously described for resist mask 26 (FIG. 1B). However, in this case the second resist mask 32 has a thickness "T2" that is less than a height "H" of the projections 14 (T2<H). The second resist mask 32 includes openings 34 formed in a required pattern. The openings 34 expose portions of the first conductive layer 24A for etching. In particular, the openings 34 expose stacks of material covering the tips 22 of the projections 14 for etching. In addition, the openings 34 expose portions of the second conductive layer 30, such that conductive traces 36 (FIG. 2) and bonding pads 52 (FIG. 2) can be formed by the etching process.

Figure 1E:
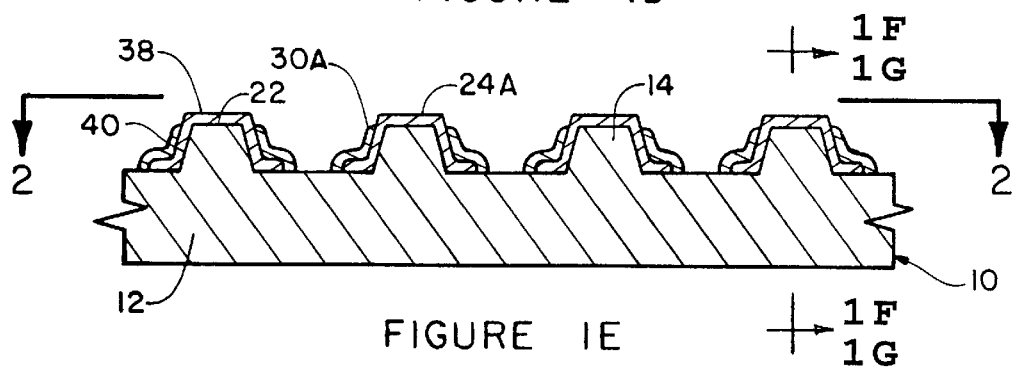

Referring to FIG. 1E, following formation of the second resist mask 32, the second resist mask 32 is used to etch the second conductive layer 30. In FIG. 1E, the etched second conductive layer is designated as 30A. The etch process is end pointed such that the tips 22 of the projections 14 remain covered by the first conductive layer 24A. This can be accomplished using an etchant that selectively etches the second conductive Layer 30 but not the first conductive layer 24A.

For example, with the first conductive layer 24A comprising a metal silicide, and the second conductive layer 30 comprising a metal, a solution of $NH_3/H_2O_2$ or $H_2SO_4/H_2O_2$ can be employed to etch the metal selective to the metal silicide. Alternately, a dry etch process can be used to etch the metal selective to the metal silicide.

The resultant contact members 38 comprise projections 14, having tips 22 covered by the first conductive layer 24A, and sidewalls 40 covered by stacks that include portions of the first conductive layer 24A, and the second conductive layer 30A. The contact members 38 are adapted to electrically engage contacts 16 (FIG. 4) on a semiconductor component 18 for testing. In addition, as shown in FIG. 2, the completed interconnect 10 includes conductive traces 36 in electrical communication with the contact members 38. The conductive traces 36 provide separate electrical paths to the contact members 38. Areas on the substrate 12 circumjacent to the contact members 38 are also covered by stacks that include portions of the first conductive layer 24A, and the second conductive layer 30A. These areas form the interface between the conductive traces 36 and the contact members 38.

Figure 1F:
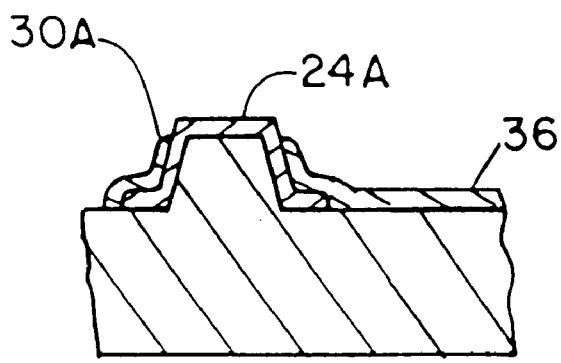

As shown in FIG. 1F, the conductive traces 36 can be formed of the same metal as the etched second conductive layer 30A. In this case the second resist mask 32 (FIG. 1D) can be used to etch the second conductive layer 30 (FIG. 1D) to form the conductive traces 36.

Figure 1G:
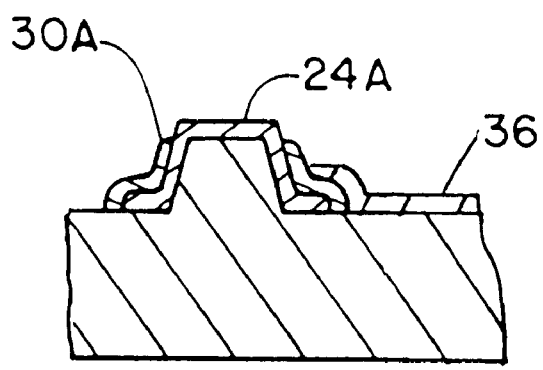

Alternately, as shown in FIG. 1G, the conductive traces 36 can comprise a different metal than the etched second conductive layer 30A. In this case, a separate metallization process can be used to form the conductive traces 36. This separate metallization process can comprise blanket deposition of a metal layer, using CVD or other deposition process. The above identified metals for forming the second conductive layer 30 can also be used to form the blanket deposited metal layer. Following blanket deposition, an etch mask can be formed for etching the metal layer using a suitable wet etchant. In the completed structure, the etched second conductive layer 30A forms a barrier layer between the conductive traces 36 and the etched first conductive layer 24A.

Die Level Test System

Referring to FIGS. 3A and 3B, a die level test system 42D employing the interconnect 10 is illustrated. The die level test system 42D can be used to test semiconductor components 18, such as bare dice and chip scale packages.

The die level test system 42D includes the interconnect 10 mounted to a test carrier 44. The test carrier 44 is configured to contain one or more components 18 for testing. In addition, the test carrier 44 is electrically connectable to a burn-in board 46 in electrical communication with test circuitry 48. The test carrier 44 can be constructed as disclosed in U.S. Pat. No. 5,519,332; U.S. Pat. No. 5,541,525; U.S. Pat. No. 5,495,179; or U.S. Pat. No. 5,302,891, which are incorporated by reference.

As shown in FIG. 6B, the interconnect 10 can be electrically connected to the test carrier 44 by wire bonds 50. The wire bonds 50 can be bonded to the bonding pads 52 on the interconnect 10, and to corresponding bonding pads 52A on the test carrier 44. The interconnect 10 can also include a stepped edge 54 to provide clearance for the wire bonds 50. The test carrier 44 can include external contacts 56, such as electrical pins, that are in electrical communication with the bonding pads 52 and electrically connectable to the burn-in board 46 and test circuitry 48.

The test carrier 44 can also include a biasing mechanism (not shown) for biasing the component 18 against the interconnect 10. The test circuitry 48 is adapted to transmit test signals to the integrated circuits on the component 18 and to analyze the resultant signals. Suitable test circuitry 48 is commercially available from Teradyne, Advantest, and Hewlett-Packard. The burn-in board 46 can also be in the form of a conventional burn-in board.

Wafer Level Test System

Figure 4A:
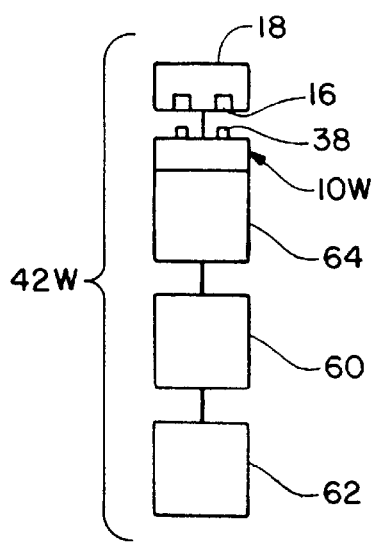
FIG. 4A is a block diagram of a wafer level test system employing an interconnect constructed in accordance with the invention.
Figure 4B:
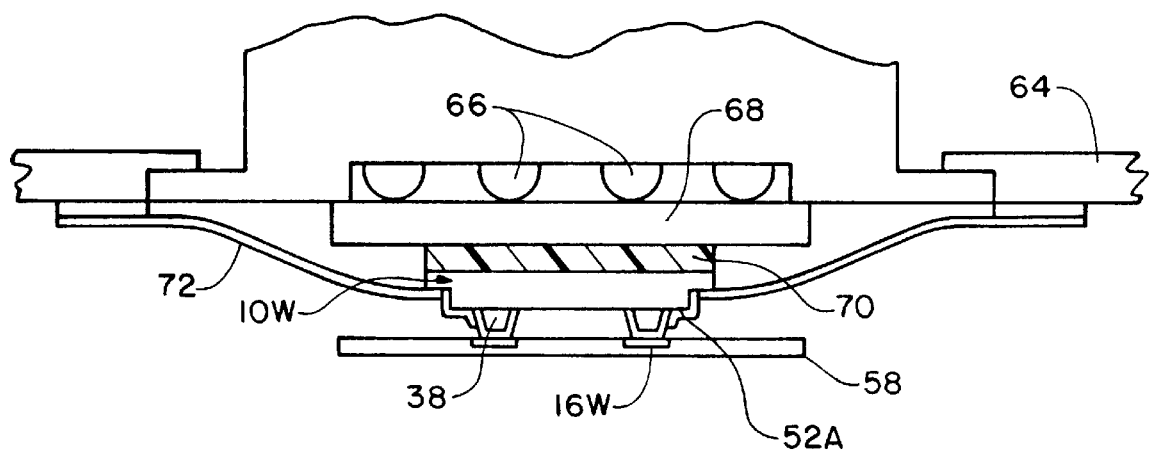
FIG. 4B is a schematic cross sectional view of the system shown in FIG. 4A.

Referring to FIGS. 4A and 4B, a wafer level test system 42W employing a wafer level interconnect 10W is illustrated. The wafer level interconnect 10W can be constructed substantially as previously described for interconnect 10 but sized for testing a semiconductor wafer 58 or portion thereof. The wafer level interconnect 10W includes contact members 38 as previously described in electrical communication with bonding pads 52.

In addition to the wafer level interconnect 10W, the wafer level test system 42W includes a testing apparatus 60 in electrical communication with testing circuitry 62. The testing apparatus 60 can be a conventional wafer probe handler, or probe tester, modified for use with the interconnect 10W. Wafer probe handlers and associated test equipment are commercially available from Electroglass, Advantest, Teradyne, Megatest, Hewlett-Packard and others. In this system 42W, the interconnect 10W takes the place of a conventional probe card and mounts to a probe card fixture 64 of the testing apparatus 60.

With interconnect 10W mounted to the testing apparatus 60, the testing apparatus 60 can be used to step the wafer 58, or to step the interconnect 10W, so that the dice on the wafer 58 can be tested in groups until all of the dice on the wafer 58 have been tested.

As shown in FIG. 4B, the interconnect 10W can mount to the probe card fixture 64 of the testing apparatus 60. The probe card fixture 64 can be similar in construction to a conventional probe card fixture commercially available from manufacturers such as Packard Hughes Interconnect and Wentworth Laboratories. The probe card fixture 64 can be formed of an electrically insulating material such as FR-4 or ceramic. In addition, the testing apparatus 60 can include a force applying mechanism 66 associated with the probe card fixture 64.

The interconnect 10W can be mounted to a mounting plate 68 in contact with the force applying mechanism 66.

The force applying mechanism 66 can be spring loaded pins or equivalent elements. In addition, a biasing member 70 formed of an elastomeric material, or as a fluid or gas filled bladder, can be mounted between the mounting plate 68 and interconnect 10W.

Still further, conductive paths 72 can be formed from the probe card fixture 64 to the interconnect 10W. By way of example, the conductive paths 72 can comprise multi layered tape with laminated conductors similar to TAB tape, or ASMAT manufactured by Nitto, Denko. Bonded connections can be formed to the bonding pads 52 on the interconnect 10W.

Further details of a wafer level test system similar to test system 42W are contained in U.S. patent application Ser. No. 08/797,719, filed Feb. 11, 1997, entitled "PROBE CARD FOR SEMICONDUCTOR WAFERS AND METHOD AND SYSTEM FOR TESTING WAFERS" which is incorporated herein by reference.

While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor structure comprising:
   providing a substrate with a feature thereon;
   forming a first conductive layer on the feature and the substrate;
   at least partially removing the first conductive layer from the substrate, while leaving the feature at least partially covered, using a first resist mask having a first thickness greater than a height of the feature;
   forming a second conductive later on the first conductive layer and the substrate; and
   removing the second conductive layer from at least a portion of the feature using a second resist mask having a second thickness less than the height of the feature.

2. The method of claim 1 wherein removing the second conductive layer is to an endpoint of the first conductive layer leaving the feature at least partially covered by the first conductive layer.

3. The method of claim 1 wherein the first resist mask comprises an epoxy resin, an organic solvent, and a photo initiator.

4. The method of claim 1 wherein the first conductive layer comprises a metal silicide and the second conductive layer comprises a metal.

5. The method of claim 1 wherein the structure comprises an interconnect for testing semiconductor components and the feature comprises a contact member on the interconnect.

6. A method for fabricating an interconnect for a semiconductor component comprising:
   providing a substrate with a projection having a tip;
   forming a first conductive layer on the projection and the substrate;
   etching the first conductive layer from portions of the substrate using a first resist mask having a first thickness greater than a height of the projection;
   forming a second conductive layer on the first conductive layer and the substrate; and
   etching the second conductive layer from the tip using a second resist mask having a second thickness less than the height of the projection.

7. The method of claim 6 wherein following etching of the second conductive layer, the tip remains covered by the first conductive layer and a sidewall of the projection is covered by a stack of the first and second conductive layer.

8. The method of claim 6 wherein etching the second conductive layer forms conductive traces on the substrate.

9. The method of claim 6 further comprising forming conductive traces on the substrate in electrical communication with the second conductive layer using a metallization process.

10. A method for fabricating an interconnect for a semiconductor component comprising:
    providing a substrate with a plurality of projections having tip portions and sidewalls;
    forming a first conductive layer on the projections and the substrate;
    patterning the first conductive layer using a first resist mask having a first thickness greater than a height of the projections, leaving the tip portions of the projections covered by the first conductive layer;
    forming a second conductive layer on the projections and the substrate; and
    patterning the second conductive layer using a second resist mask having a second thickness less than the height of the projections, to remove the second conductive layer from the tip portions and form conductive traces in electrical communication with the first conductive layer on the tip portions.

11. The method of claim 10 wherein the first and second resist mask comprise an epoxy resin, an organic solvent and a photo initiator.

12. The method of claim 10 wherein patterning the second conductive layer is by selectively etching the second conductive layer with respect to the first conductive layer.

13. The method of claim 10 wherein patterning the second conductive layer is by etching the second conductive layer and endpointing at the first conductive layer.

14. A method for fabricating an interconnect for a semiconductor component comprising:
    providing a substrate with a projection having a tip and a sidewall;
    forming a metal silicide layer on the projection and the substrate;
    forming a first resist mask that covers the projection and the substrate;
    etching the metal silicide layer using the first resist mask;
    forming a metal layer on the metal silicide layer and the substrate;
    forming a second resist mask on the projection and the substrate, the second resist mask having a thickness less than a height of the projection to expose the metal layer on the tip; and
    etching the metal layer from the tip.

15. The method of claim 14 wherein etching the metal layer forms conductive traces on the substrate.

16. The method of claim 14 further comprising depositing a second metal layer on the metal layer and substrate and etching the second metal layer to form conductive traces.

17. The method of claim 14 wherein the first resist mask comprise an epoxy resin, an organic solvent, and a photo initiator.

18. A method for fabricating an interconnect for a semiconductor component comprising:
    providing a substrate comprising a plurality of projections;
    forming a first conductive layer on the projections and substrate;

forming a first resist mask that covers the projections;

etching the first conductive layer from the substrate using the first resist mask, leaving the projections at least partially covered;

depositing a second conductive layer on the projections and substrate;

forming a second resist mask having a thickness less than the projections to at least partially expose the first conductive layer on the projections, the second resist mask including openings exposing the second conductive layer in a pattern for conductive traces; and etching the second conductive layer from portions of the projections and the substrate to form contact members comprising tip portions covered by the first conductive layer and conductive traces formed by the second conductive layer.

19. The method of claim 18 wherein the first and second resist mask comprise an epoxy resin, an organic solvent, and a photo initiator.

20. The method of claim 18 wherein the projections and the substrate comprise silicon.

21. The method of claim 18 wherein the projections have a height between about 3 to 10 mils and a width between about 0.5 to 5 mils.

22. The method of claim 18 wherein the first conductive layer comprises a metal silicide and the second conductive layer comprises a metal.

23. A method for fabricating an interconnect for a semiconductor component comprising:

providing a substrate with a projection having a tip and a sidewall;

forming a first conductive layer on the tip, on the sidewall, and on the substrate;

covering the projection with a first resist mask having a thickness greater than a height of the projection while exposing at least a portion of the first conductive layer on the substrate;

etching the first conductive layer from the substrate using the first resist mask;

forming a second conductive layer on the first conductive layer and the substrate;

covering the sidewalls of the projection with a second resist mask having a second thickness less than the height of the projection; and etching the second conductive layer from at least a portion of the projection using the second resist mask.

24. The method of claim 23 wherein the first resist mask and the second resist mask comprise an epoxy resin, an organic solvent, and a photo initiator.

* * * * *

UNITED STATES PATENT AND TRADEMARK OFFICE
CERTIFICATE OF CORRECTION

PATENT NO : 6,103,613
DATED : August 15, 2000
INVENTOR(S): Salman Akram

It is certified that error appears in the above-identified patent and that said Letters Patent are hereby corrected as shown below:

In column 1, line 36, after "difficult" add --to--.

In column 2, line 14, remove the bracket "(".

In column 2, line 43, remove "can".

In claim 1 at column 7, line 34, change "later" to --layer--.

Signed and Sealed this

Tenth Day of April, 2001

Attest:

NICHOLAS P. GODICI

Attesting Officer      Acting Director of the United States Patent and Trademark Office